(12) United States Patent
Kumar et al.

(10) Patent No.: US 10,253,410 B2
(45) Date of Patent: Apr. 9, 2019

(54) PVD-COATED CUTTING TOOLS AND METHOD FOR MAKING THE SAME

(71) Applicant: KENNAMETAL INC., Latrobe, PA (US)

(72) Inventors: Vineet Kumar, Latrobe, PA (US); Ronald M. Penich, Greensburg, PA (US); Peter R. Leicht, Latrobe, PA (US); Mark S. Greenfield, Latrobe, PA (US); Yixiong Liu, Greensburg, PA (US)

(73) Assignee: KENNAMETAL INC., Latrobe, PA (US)

( * ) Notice: Subject to any disclaimer, the term of this patent is extended or adjusted under 35 U.S.C. 154(b) by 170 days.

(21) Appl. No.: 15/487,209

(22) Filed: Apr. 13, 2017

(65) Prior Publication Data
US 2017/0218511 A1    Aug. 3, 2017

Related U.S. Application Data

(63) Continuation of application No. 14/645,554, filed on Mar. 12, 2015, now Pat. No. 9,650,713.

(51) Int. Cl.
*C23C 16/32* (2006.01)
*C23C 16/34* (2006.01)
(Continued)

(52) U.S. Cl.
CPC .............. *C23C 16/34* (2013.01); *C23C 16/32* (2013.01); *C23C 16/36* (2013.01); *C23C 28/042* (2013.01)

(58) Field of Classification Search
USPC ............... 51/307, 309; 428/216, 336, 698; 204/192.15, 192.16; 427/255.23, 255.28,
(Continued)

(56) References Cited

U.S. PATENT DOCUMENTS

| 4,525,415 A | 6/1985 | Porat |
|---|---|---|
| 5,250,367 A | 10/1993 | Santhanam |

(Continued)

FOREIGN PATENT DOCUMENTS

| WO | 02095808 | 11/2002 |
|---|---|---|
| WO | 2008008207 | 1/2008 |

*Primary Examiner* — Archene A Turner
(74) *Attorney, Agent, or Firm* — Larry R. Meenan

(57) ABSTRACT

A coated cutting insert includes a substrate that is either a ceramic substrate or polycrystalline cubic boron nitride-containing substrate and has a substrate surface. A base coating scheme is applied by chemical vapor deposition to the substrate surface wherein the base coating scheme includes the following coating layers: an inner coating layer adjacent to the substrate surface wherein the inner coating layer is a nitride selected from the group consisting of titanium nitride, zirconium nitride and hafnium nitride; an inner mediate coating layer deposited to the inner coating layer wherein the inner mediate coating layer is a carbonitride selected from the group consisting of titanium carbonitride, zirconium carbonitride and hafnium carbonitride; an outer mediate coating layer deposited to the inner mediate coating layer and wherein the outer mediate coating layer is a carbonitride selected from the group consisting of titanium carbonitride, zirconium carbonitride and hafnium carbonitride; and an outer coating layer deposited on the outer mediate coating layer wherein the outer coating layer is a carbide selected from the group consisting of titanium carbide, zirconium carbide and hafnium carbide. An exterior coating scheme is deposited on the base coating scheme by physical vapor deposition.

20 Claims, 1 Drawing Sheet

(51) Int. Cl.
*C23C 16/36* (2006.01)
*C23C 28/04* (2006.01)

(58) Field of Classification Search
USPC ....... 427/255.39, 391, 255.394, 419.1, 419.7
See application file for complete search history.

(56) References Cited

U.S. PATENT DOCUMENTS

| | | |
|---|---|---|
| 5,300,321 A | 4/1994 | Nakano |
| 5,972,179 A | 10/1999 | Chittipeddi |
| 6,010,940 A | 1/2000 | Lee |
| 6,562,715 B1 | 5/2003 | Chen |
| 6,599,062 B1 | 7/2003 | Oles |
| 6,811,580 B1 | 11/2004 | Littecke |
| 2001/0004478 A1 | 6/2001 | Zhao |
| 2009/0087585 A1 | 4/2009 | Lee |
| 2011/0176878 A1 | 7/2011 | Nomura |

PVD-COATED CUTTING TOOLS AND METHOD FOR MAKING THE SAME

This application is a continuation of U.S. patent application Ser. No. 14/645,554 filed Mar. 12, 2015, the entire disclosure of which is incorporated herein by reference.

BACKGROUND

The invention pertains to a coated cutting tool, and in particular, to a cutting tool with a ceramic or polycrystalline cubic boron nitride (PCBN) substrate wherein the coating is applied by a physical vapor deposition (PVD) technique. More particularly, the invention pertains to a cutting tool with a ceramic or polycrystalline cubic boron nitride (PCBN) substrate wherein the coating is applied by a physical vapor deposition (PVD) technique, but prior to the application of the PVD coating scheme, a base coating scheme is applied by chemical vapor deposition (CVD) to the surface of the substrate.

Heretofore, a combination of CVD coating techniques and PVD coating techniques has been used to coat articles. For example, in the context of a cutting tool, U.S. Pat. No. 5,250,367 to Santhanam et al. pertains to a cemented carbide substrate that has a coating scheme thereon. The coating scheme has a CVD coating region on the substrate and a PVD coating on the CVD coating scheme. U.S. Patent Application Publication No. US 2011/0176878 A1 to Nomura discloses a drill head that contains hard cutting tips brazed to the drill head. The cutting tips have a CVD coating region on the cutting tip and a PVD coating on the CVD coating scheme. U.S. Pat. No. 6,599,062 to Oles discloses a polycrystalline boron nitride substrate for a cutting tool. The coating scheme is generally described at Col. 2, lines 16-37, which reads:

> This need is met by the coated cutting tool and method of the present invention which are useful for hard turning. The cutting tool of the present invention includes a blank/substrate of polycrystalline cubic boron nitride having a rake surface roughness of no more than about 8 to 10 microinches R.sub.a, having a refractory hard coating containing aluminum applied thereto by one of a CVD or PVD technique or combination thereof. Preferably, the coating includes a titanium aluminum nitride layer (e.g., TiAlN) deposited onto the substrate via a PVD technique in a thickness of at least 2 micrometers, and preferably about 2 to 5 micrometers, and more preferably about 3 micrometers in thickness. The PCBN preferably includes at least 40 vol % CBN in addition to the binder.
>
> The coating may alternatively include a lower layer of aluminum oxide (e.g., $Al_2O_3$), deposited with or without underlayers of TiN, TiC, TiCN, TiAlN, TiOCN between it and the substrate, and optionally, with an outer layer, for example, of titanium nitride (TiN). A primary function of the outer layer is to act as a visual wear indicator for the machine operator. This layer is typically lighter colored than the substrate of the tool insert.

PCT International Publication No. WO 2008/008207 A2 to Inspektor et al. discloses a cutting tool that has an anodized top coating layer. A general description of the pre-anodized cutting tool is at Paragraphs [0029][0031], which read:

> [0029] Referring to the specific embodiment illustrated in FIGS. 3A, 3B and 3C, FIG. 3A shows a pre-anodized cutting tool (generally designated as 30) with a pre-anodizable coating scheme (bracket 32) thereon. In this regard, the pre-anodized cutting tool 30 comprises a substrate 34 that has at least one surface 36. While the substrate 34 may vary in composition depending upon the application, the material for the substrate can be selected from the group comprising cemented carbides (e.g., cobalt cemented tungsten carbides), ceramics (e.g., SiAlON's) and cermets (titanium carbonitride-based materials) and high speed steels).
>
> [0030] The pre-anodizable coating scheme 32 includes an underlayer coating arrangement shown by brackets 40. The underlayer coating arrangement 40 may take on any one of many different coating architectures. It may comprise a single coating layer or it may comprise a plurality of coating layers possibly in a periodic sequence or not in a periodic sequence. The thicknesses of the various coating layer(s) in the underlayer coating arrangement 40 can also vary depending upon the specific application.
>
> [0031] The method to apply the coating underlayer arrangement 40 may also vary depending upon the application wherein the method may include physical vapor deposition, chemical vapor deposition, and various variations or modifications or combinations thereof known to those of ordinary skill in the art. Exemplary coating arrangements that could serve as the underlayer coating arrangement 40 are shown and described in the following U.S. Pat. No. 5,864,297 and U.S. Pat. No. 5,858,181 to Jindal et al. for Physical Vapor Deposition of Titanium Nitride on a Nonconductive Substrate, U.S. Pat. No. 5,879,823 to Prizzi et al. for a Coated Cutting Tool, and U.S. Pat. No. 5,364,209 to Santhanam et al. for a Coated Cutting Tools. Each one of these patents is assigned to Kennametal Inc. of Latrobe, Pa. 15650 United States of America, and is hereby incorporated by reference herein.

The following patent documents pertain to the application of a CVD titanium nitride layer on top of which is applied a PVD coating scheme in the context of electronic components: U.S. Pat. No. 5,300,321 to Nakano et al., U.S. Pat. No. 5,972,179 to Chittipeddi et al., U.S. Pat. No. 6,010,940 to Lee et al., U.S. Pat. No. 6,562,715 to Chen et al., U.S. Patent Application Publication No. US 2001/0004478 to Zhao et al., U.S. Patent Application Publication No. US 2009/0087585 A1 to Lee et al., and PCT International Publication No. WO 02/095808 A1 to Bagley et al.

While the above documents mention PVD coating and CVD coating, there remains a need to provide a PVD-coated ceramic substrate or PVD-coated polycrystalline cubic boron nitride (PcBN) substrate, as well as a method of PVD coating a ceramic substrate or a PcBN substrate. In this regard, ceramic cutting tools and PcBN cutting tools are generally electrically non-conductive. Application of coatings via a PVD technique generally involves the deposition of charged particles onto the surface of the ceramic substrate or the PcBN substrate. Further, the ceramic substrate or the PcBN substrate may need to be pre-treated with a plasma treatment such as etching prior to the PVD coating process. Overall, the low electrical conductivity of the ceramic substrate and the PcBN substrate renders these materials difficult to apply a coating via a PVD technique.

The above difficulty associated with the low electrical conductivity of the ceramic substrate and the PcBN substrate can be overcome by the application via a chemical vapor deposition (CVD) technique of an electrically conducting base coating scheme prior to the application of the PVD coating. There is an advantage associated with the CVD process for a ceramic substrate or a PcBN substrate in that CVD does not require the deposition of charged particles prior to the CVD coating process. A base CVD coating scheme with electrically conductive properties and sufficient thickness (a minimum of 100 nanometers) will enable the use of a PVD coating process to coat the CVD-coated substrate.

SUMMARY OF THE INVENTION

In one form thereof, the invention is a coated cutting insert includes a substrate that is either a ceramic substrate or polycrystalline cubic boron nitride-containing substrate and has a substrate surface. A base coating scheme is applied by chemical vapor deposition to the substrate surface wherein the base coating scheme includes the following coating layers: an inner coating layer adjacent to the substrate surface wherein the inner coating layer is a nitride selected from the group consisting of titanium nitride, zirconium nitride and hafnium nitride; an inner mediate coating layer deposited to the inner coating layer wherein the inner mediate coating layer is a carbonitride selected from the group consisting of titanium carbonitride, zirconium carbonitride and hafnium carbonitride; an outer mediate coating layer deposited to the inner mediate coating layer and wherein the outer mediate coating layer is a carbonitride selected from the group consisting of titanium carbonitride, zirconium carbonitride and hafnium carbonitride; and an outer coating layer deposited on the outer mediate coating layer wherein the outer coating layer is a carbide selected from the group consisting of titanium carbide, zirconium carbide and hafnium carbide. An exterior coating scheme is deposited on the base coating scheme by physical vapor deposition.

In another form thereof, the invention is a method for making a coated cutting insert comprising the steps of: providing a substrate wherein the substrate is either a ceramic substrate or polycrystalline cubic boron nitride-containing substrate; depositing by chemical vapor deposition an inner coating layer adjacent to the substrate surface, and the inner coating layer comprising a nitride selected from the group consisting of titanium nitride, zirconium nitride and hafnium nitride; depositing on the inner coating layer by chemical vapor deposition an inner mediate coating layer wherein the inner mediate coating layer comprising a carbonitride selected from the group consisting of titanium carbonitride, zirconium carbonitride and hafnium carbonitride; depositing on the inner mediate coating layer by chemical vapor deposition an outer mediate coating layer wherein the outer mediate coating layer comprising a carbonitride selected from the group consisting of titanium carbonitride, zirconium carbonitride and hafnium carbonitride; depositing on the outer mediate coating layer by chemical vapor deposition an outer coating layer comprising a carbide selected from the group consisting of titanium carbide, zirconium carbide and hafnium carbide; and depositing on the outer coating layer by physical vapor deposition an exterior coating scheme.

BRIEF DESCRIPTION OF THE DRAWINGS

The following is a brief description of the drawings that form a part of this patent application.

DETAILED DESCRIPTION

Figure 1:
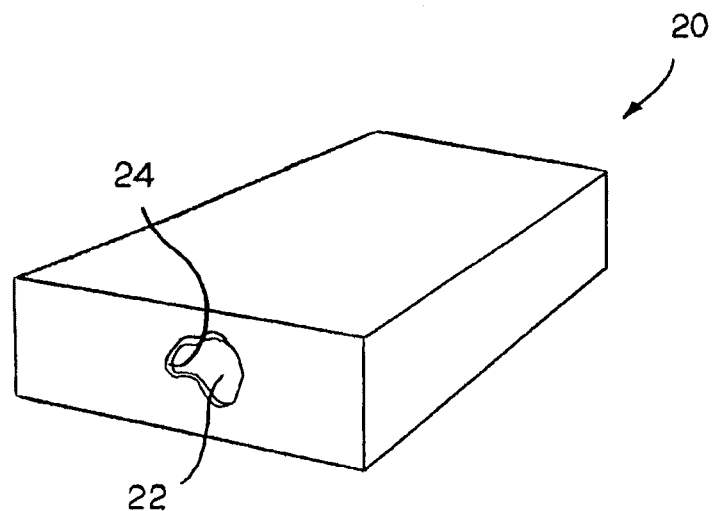
FIG. 1 is an isometric of a coated cutting tool with a portion of the coating scheme removed to expose the substrate.
Figure 2:
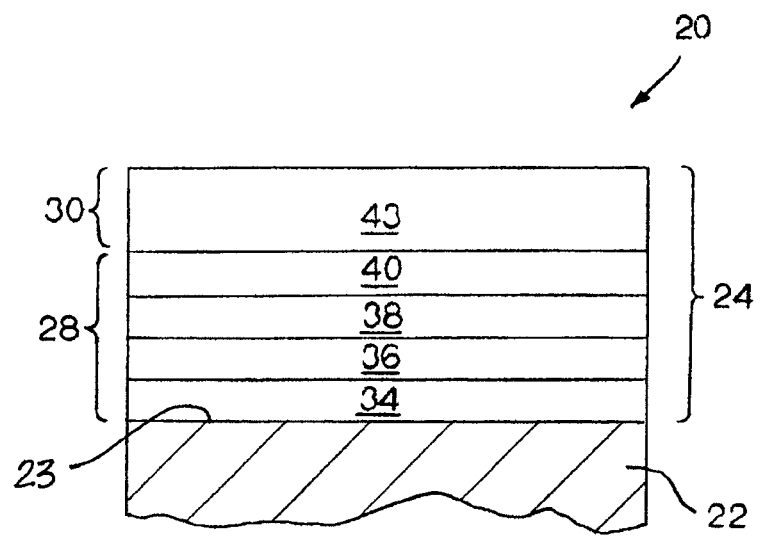
FIG. 2 is a schematic cross-sectional view of a coating scheme of FIG. 1 showing the CVD coating scheme and the PVD coating scheme.

Referring to the drawings, FIGS. 1 and 2 illustrate a specific embodiment of a coated cutting insert generally designated as 20. Coated cutting insert 20 includes a substrate 22 and a coating scheme 24 on the surface 23 of the substrate 22. The substrate 22 can be a ceramic substrate or a polycrystalline cubic boron nitride (PcBN) substrate. Exemplary materials for the substrate include ceramics such as, for example, silicon nitride ($Si_3N_4$), yttria ($Y_2O_3$), alumina ($Al_2O_3$), aluminum nitride (AlN), ytterbia ($Yb_2O_3$), $La_2O_3$, MgO, $MgAlO_4$ and $HfO_2$. The polycrystalline cubic boron nitride can be in a metal or a ceramic binder.

In reference to the coating scheme 24, there is base coating scheme 28 that is deposited by CVD on the substrate 22 and a PVD coating scheme 30 on the base coating scheme 28. The thickness of the base coating scheme 28 can range between about 1.3 micrometers and about 35 micrometers. In the alternative, the thickness of the base coating scheme 28 can range between about 3 micrometers and about 21 micrometers. The base coating scheme 28 comprises an inner coating layer 34 deposited by CVD directly on the surface 23 of the substrate 22. The inner coating layer 34 is a nitride of titanium, hafnium or zirconium (i.e., titanium nitride, hafnium nitride or zirconium nitride) and has a thickness that ranges between about 0.1 micrometers and about 5 micrometers. In an alternative, the thickness of inner coating layer 34 can range between about 0.5 micrometers and about 3 micrometers.

There is an inner mediate coating layer 36 deposited by MT-CVD on the inner coating layer 34 wherein the inner mediate coating layer 36 is a carbonitride of titanium, hafnium or zirconium (i.e., titanium carbonitride, hafnium carbonitride or zirconium carbonitride) and has a thickness that ranges between about 0.5 micrometers and about 10 micrometers. In an alternative, the thickness of inner coating layer 36 can range between about 1 micrometers and about 6 micrometers. There is an outer mediate coating layer 38 deposited by CVD on the inner mediate coating layer 36. The outer mediate coating layer 38 is a carbonitride of titanium, hafnium or zirconium (i.e., titanium carbonitride, hafnium carbonitride or zirconium carbonitride) and has a thickness that ranges between about 0.5 micrometers and about 10 micrometers. In an alternative, the thickness of outer mediate coating layer 38 can range between about 1 micrometers and about 6 micrometers.

There is an outer coating layer 40 deposited by CVD on the outer mediate coating layer 38 and outer coating layer 40 and outer coating layer 40 is a carbide of titanium, hafnium or zirconium (i.e., titanium carbide, hafnium carbide or zirconium carbide). Outer coating layer 40 has a thickness that ranges between about 0.2 micrometers and about 10 micrometers. In an alternative, the thickness of outer coating layer 40 can range between about 0.5 micrometers and about 6 micrometers.

A PVD coating layer or exterior coating scheme 43 is deposited by PVD on the surface of the outer coating layer 40. Referring to the coatings deposited by physical vapor deposition (PVD), suitable coatings include without limitation carbides, nitrides, carbonitrides, and borides of the Group IV, V, and VI elements of the Periodic Table and aluminum.

Tables 1 through 3 set forth the coating parameters for the application of the CVD base coating schemes. Table 1 sets forth the coating parameters for a titanium-based CVD base coating scheme, Table 2 sets forth the coating parameters for a zirconium-based CVD base coating scheme Table 3 sets forth the coating parameters for a hafnium-based CVD base coating scheme.

TABLE 1

Titanium-Based CVD Base Coating Scheme

| Base Coating Layers | Gas Mixture (volume percent of the gaseous mixture) | Temp. (° C.) | Pres. (Torr) | Duration (minutes) |
|---|---|---|---|---|
| Inner Layer on Substrate: TiN | $H_2$ (80.3 vol. %) + $N_2$ (18.8 vol. %) + $TiCl_4$ (0.9 vol. %) | 800-1050 | 60-300 | 20-60 |
| Inner Mediate Layer: TiCN (MT) | $H_2$ (69.8 vol. %) + $N_2$ (28.2 vol. %) + $TiCl_4$ (1.1 vol. %) + $CH_3CN$ (0.9 vol. %) | 750-1050 | 30-120 | 60-300 |
| Outer Mediate Layer: TiCN (HT) | $H_2$ (71.1 vol. %) + $N_2$ (19.2 vol. %) + $TiCl_4$ (1.1 vol. %) + $CH_4$ (18.6 vol. %) | 900-1050 | 30-300 | 30-100 |
| Outer Layer: TiC | $H_2$ (72.1 vol. %) + $TiCl_4$ (1.1 vol. %) + $CH_4$ (26.8 vol. %) | 950-1050 | 30-300 | 30-200 |

TABLE 2

Zirconium-Based CVD Base Coating Scheme

| Base Coating Layers | Gas Mixture (volume percent of the gaseous mixture) | Temp. (° C.) | Pres. (Torr) | Duration (minutes) |
|---|---|---|---|---|
| Inner Layer on Substrate: ZrN | $H_2$ (78.4 vol. %) + $N_2$ (20.4 vol. %) + $ZrCl_4$ (1.2 vol. %) | 800-1050 | 60-300 | 20-60 |
| Inner Mediate Layer: ZrCN (MT) | $H_2$ (96.1 vol. %) + $N_2$ (0 vol. %) + $ZrCl_4$ (2.1 vol. %) + $CH_3CN$ (1.8 vol. %) | 750-1050 | 30-120 | 60-300 |
| Outer Mediate Layer: ZrCN (HT) | $H_2$ (70.5 vol. %) + $N_2$ (10.2 vol. %) + $ZrCl_4$ (1.1 vol. %) + $CH_4$ (18.2 vol. %) | 900-1050 | 30-300 | 30-100 |
| Outer Layer: ZrC | $H_2$ (69.3 vol. %) + $ZrCl_4$ (1.2 vol. %) + $CH_4$ (29.5 vol. %) | 950-1050 | 30-300 | 30-200 |

TABLE 3

Hafnium-Based CVD Base Coating Scheme

| Base Coating Layers | Gas Mixture (volume percent of the gaseous mixture) | Temp. (° C.) | Pres. (Torr) | Duration (minutes) |
|---|---|---|---|---|
| Inner Layer on Substrate: HfN | $H_2$ (81.2 vol. %) + $N_2$ (17.5 vol. %) + $HfCl_4$ (1.3 vol. %) | 800-1050 | 60-300 | 20-60 |
| Inner Mediate Layer: HfCN (MT) | $H_2$ (95.9 vol. %) + $N_2$ (0 vol. %) + $HfCl_4$ (2.3 vol. %) + $CH_3CN$ (1.8 vol. %) | 750-1050 | 30-120 | 60-300 |
| Outer Mediate Layer: HfCN (HT) | $H_2$ (70.4 vol. %) + $N_2$ (10.3 vol. %) + $HfCl_4$ (1.2 vol. %) + $CH_4$ (18.9 vol. %) | 900-1050 | 30-300 | 30-100 |
| Outer Layer: HfC | $H_2$ (73.1 vol. %) + $HfCl_4$ (1.1 vol. %) + $CH_4$ (25.8 vol. %) | 950-1050 | 30-300 | 30-200 |

In reference to the ranges of the components of the various gaseous mixtures, for the method to make the titanium-based coating scheme, when the inner coating layer comprises titanium nitride, the gaseous mixture for the inner coating layer depositing step comprises hydrogen present in an amount between about 60 volume percent and about 90 volume percent of the gaseous mixture, nitrogen present in an amount between about 10 volume percent and about 40 volume percent of the gaseous mixture, and $TiCl_4$ present in an amount between about 0.3 volume percent and about 3 volume percent of the gaseous mixture. When the inner mediate coating layer comprising titanium carbonitride, the gaseous mixture for the inner mediate coating depositing step comprising hydrogen present in an amount between about 55 volume percent and about 90 volume percent of the gaseous mixture, nitrogen present in an amount between about 10 volume percent and about 40 volume percent of the gaseous mixture, $TiCl_4$ present in an amount between about 0.3 volume percent and about 3 volume percent of the gaseous mixture, $CH_3CN$ present in an amount between about 0.3 volume percent and about 3 volume percent of the gaseous mixture. When the outer mediate coating layer comprising titanium carbonitride, the gaseous mixture for the inner mediate coating depositing step comprising hydrogen present in an amount between about 60 volume percent and about 90 volume percent of the gaseous mixture, nitrogen present in an amount between about 5 volume percent and about 25 volume percent of the gaseous mixture, $TiCl_4$ present in an amount between about 0.3 volume percent and about 3 volume percent of the gaseous mixture, $CH_4$ present in an amount between about 10 volume percent and about 30 volume percent of the gaseous mixture. When the outer coating layer comprising titanium carbide, the gaseous mixture for the outer coating layer depositing step comprising hydrogen present in an amount between about 60 volume percent and about 90 volume percent of the gaseous mixture, $TiCl_4$ present in an amount between about 0.3 volume percent and about 3 volume percent of the gaseous mixture, $CH_4$ present in an amount between about 10 volume percent and about 35 volume percent of the gaseous mixture.

In reference to the ranges of the components of the various gaseous mixtures, for the method to make the zirconium-based coating scheme, when the inner coating layer comprises zirconium nitride, the gaseous mixture for the inner coating layer depositing step comprises hydrogen present in an amount between about 60 volume percent and about 90 volume percent of the gaseous mixture, nitrogen present in an amount between about 10 volume percent and about 40 volume percent of the gaseous mixture, and $ZrCl_4$ present in an amount between about 0.3 volume percent and about 3 volume percent of the gaseous mixture. When the inner mediate coating layer comprising zirconium carbonitride, the gaseous mixture for the inner mediate coating depositing step comprising hydrogen present in an amount between about 80 volume percent and about 98 volume percent of the gaseous mixture, nitrogen optionally present in an amount up to about 20 volume percent of the gaseous mixture, $ZrCl_4$ present in an amount between about 0.3 volume percent and about 3 volume percent of the gaseous mixture, $CH_3CN$ present in an amount between about 0.3 volume percent and about 3 volume percent of the gaseous mixture. When the outer mediate coating layer comprising zirconium carbonitride, the gaseous mixture for the inner mediate coating depositing step comprising hydrogen present in an amount between about 60 volume percent and about 90 volume percent of the gaseous mixture, nitrogen present in an amount between about 5 volume percent and about 25 volume percent of the gaseous mixture, $ZrCl_4$ present in an amount between about 0.3 volume percent and about 3 volume percent of the gaseous mixture, $CH_4$ present in an amount between about 10 volume percent and about 30 volume percent of the gaseous mixture. When the outer coating layer comprising zirconium carbide, the gaseous mixture for the outer coating layer depositing step comprising hydrogen present in an amount between about 60 volume percent and about 90 volume percent of the gaseous mixture, $ZrCl_4$ present in an amount between about 0.3 volume percent and about 3 volume percent of the gaseous mixture, $CH_4$ present in an amount between about 10 volume percent and about 35 volume percent of the gaseous mixture.

In reference to the ranges of the components of the various gaseous mixtures, for the method to make the hafnium-based coating scheme, when the inner coating layer comprises hafnium nitride, the gaseous mixture for the inner coating layer depositing step comprises hydrogen present in an amount between about 60 volume percent and about 90 volume percent of the gaseous mixture, nitrogen present in an amount between about 10 volume percent and about 40 volume percent of the gaseous mixture, and $HfCl_4$ present in an amount between about 0.3 volume percent and about 3 volume percent of the gaseous mixture. When the inner mediate coating layer comprising hafnium carbonitride, the gaseous mixture for the inner mediate coating depositing step comprising hydrogen present in an amount between about 80 volume percent and about 98 volume percent of the gaseous mixture, nitrogen optionally present in an amount up to about 20 volume percent of the gaseous mixture, $HfCl_4$ present in an amount between about 0.3 volume percent and about 3 volume percent of the gaseous mixture, $CH_3CN$ present in an amount between about 0.3 volume percent and about 3 volume percent of the gaseous mixture. When the outer mediate coating layer comprising hafnium carbonitride, the gaseous mixture for the inner mediate coating depositing step comprising hydrogen present in an amount between about 60 volume percent and about 90 volume percent of the gaseous mixture, nitrogen present in an amount between about 5 volume percent and about 25 volume percent of the gaseous mixture, $HfCl_4$ present in an amount between about 0.3 volume percent and about 3 volume percent of the gaseous mixture, $CH_4$ present in an amount between about 10 volume percent and about 30 volume percent of the gaseous mixture. When the outer coating layer comprising hafnium carbide, the gaseous mixture for the outer coating layer depositing step comprising hydrogen present in an amount between about 60 volume percent and about 90 volume percent of the gaseous mixture, $HfCl_4$ present in an amount between about 0.3 volume percent and about 3 volume percent of the gaseous mixture, $CH_4$ present in an amount between about 10 volume percent and about 35 volume percent of the gaseous mixture.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

The patents and other documents identified herein are hereby incorporated by reference herein in their entireties to the full extent permitted by law. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

The invention claimed is:

1. A coated cutting insert comprising:
   a substrate wherein the substrate is either a ceramic substrate or polycrystalline cubic boron nitride-containing substrate, and the substrate having a substrate surface;
   a base coating scheme applied by chemical vapor deposition to the substrate surface;
   the base coating scheme comprising an inner coating layer adjacent to the substrate surface, and the inner coating layer comprising a nitride selected from the group consisting of titanium nitride, zirconium nitride and hafnium nitride, an inner mediate coating layer deposited to the inner coating layer comprising a carbonitride selected from the group consisting of titanium carbonitride, zirconium carbonitride and hafnium carbonitride, and an outer mediate coating layer comprising a carbonitride selected from the group consisting of titanium carbonitride, zirconium carbonitride and hafnium carbonitride, and an outer coating layer comprising a carbide selected from the group consisting of titanium carbide, zirconium carbide and hafnium carbide; and
   an exterior coating scheme deposited on the base coating scheme by physical vapor deposition, the exterior coating scheme comprising a layer of carbide, nitride or boride of one or more metals selected from Groups IV, V and VI of the Periodic Table and aluminum.

2. The coated cutting insert of claim 1, wherein the substrate is ceramic.

3. The coated cutting insert of claim 2, wherein the ceramic is selected from the group consisting of polycrystalline cubic boron nitride, silicon nitride, yttria, alumina, aluminum nitride, ytterbia, $La_2O_3$, MgO, $MgAlO_4$ and $HfO_2$.

4. The coated cutting insert of claim 3, wherein the inner coating is hafnium nitride.

5. The coated cutting insert of claim 1, wherein the inner coating layer comprises titanium nitride.

6. The coated cutting insert of claim 5, wherein the inner coating layer has thickness of 0.1 μm to 5 μm.

7. The coated cutting insert of claim 5, wherein the inner mediate coating comprises titanium carbonitride, the outer mediate coating comprises titanium carbonitride and the outer coating comprises titanium carbide.

8. The coated cutting insert of claim 5, wherein the inner mediate coating comprises zirconium carbonitride, the outer mediate coating comprises zirconium carbonitride and the outer coating comprises zirconium carbide.

9. The coated cutting insert of claim 5, wherein the inner mediate coating comprises hafnium carbonitride, the outer mediate coating comprises hafnium carbonitride and the outer coating comprises hafnium carbide.

10. The coated cutting insert of claim 1, wherein the inner coating layer comprises zirconium nitride.

11. The coated cutting insert of claim 1, wherein the inner coating layer comprises hafnium nitride.

12. The coated cutting insert of claim 11, wherein the inner coating layer has thickness of 0.1 μm to 5 μm.

13. The coated cutting insert of claim 1, wherein the outer coating layer comprises titanium carbide.

14. The coated cutting insert of claim 13, wherein the outer coating layer has thickness of 0.5 μm to 6 μm.

15. The coated cutting insert of claim 1, wherein the outer coating layer comprises zirconium carbide.

16. The coated cutting insert of claim 1, wherein the outer coating layer comprises hafnium carbide.

17. The coated cutting insert of claim 16, wherein the outer coating layer has thickness of 0.5 μm to 6 μm.

18. The coated cutting insert of claim 1, wherein the exterior coating scheme has thickness of 0.2 μm to 10 μm.

19. The coated cutting insert of claim 1, wherein the exterior coating scheme has thickness of 0.5 μm to 6 μm.

20. The coated cutting insert of claim 19, wherein the base coating scheme has thickness of 3 μm to 28 μm.

\* \* \* \* \*